US012732283B1

(12) United States Patent
Lee et al.

(10) Patent No.: US 12,732,283 B1
(45) Date of Patent: Sep. 8, 2026

(54) HIGH-SPEED SINGLE-ENDED-TO-DIFFERENTIAL CONVERTER WITH SKEW CONTROL

(71) Applicant: Sicily Merger Sub II, Inc., Santa Clara, CA (US)

(72) Inventors: Wonho Lee, San Jose, CA (US); Parmanand Mishra, Cupertino, CA (US); Han Hao, Vancouver, WA (US); Ganesh Balamurugan, Hillsboro, OR (US)

(73) Assignee: Sicily Merger Sub II, Inc., Santa Clara, CA (US)

( * ) Notice: Subject to any disclaimer, the term of this patent is extended or adjusted under 35 U.S.C. 154(b) by 0 days.

(21) Appl. No.: 19/392,594

(22) Filed: Nov. 18, 2025

(51) Int. Cl.
*H04B 10/69* (2013.01)
*H03F 3/08* (2006.01)
*H04B 10/079* (2013.01)

(52) U.S. Cl.
CPC ............ *H04B 10/697* (2013.01); *H03F 3/08* (2013.01); *H04B 10/0799* (2013.01); *H04B 10/693* (2013.01)

(58) Field of Classification Search
CPC ........................ H04B 10/697; H04B 10/0799; H04B 10/693; H04B 10/25891; H04B 10/691;

(Continued)

(56) References Cited

U.S. PATENT DOCUMENTS 12,339,490 B2 6/2025 Winterbottom et al.
2013/0229211 A1* 9/2013 Nishiyama ............ H03L 7/0814 327/146

(Continued)

OTHER PUBLICATIONS

Venditto et al., "Reconfigurable Silicon Photonic Transceiver for Space-Based Communication Nodes", Journal of Lightwave Technology, vol. 44, No. 3, Oct. 20, 2025, retrieved on [Jan. 30, 2026] (15 pages total).

(Continued)

*Primary Examiner* — Hibret A Woldekidan
(74) *Attorney, Agent, or Firm* — John Maldjian, Esq.; Stevens & Lee PC

(57) ABSTRACT

Disclosed is single-ended-to-differential converter circuit implemented in an electrical integrated circuit (EIC) co-packaged with a photonic integrated circuit (PIC) using a system-in-package (SiP) architecture. A reverse-biased photodiode supplies a single-ended signal that is converted to complementary differential outputs. Adjustable skew correctors in the two differential branches are driven by a skew detection circuit that asynchronously samples the differential outputs using a non-synchronized clock. A delay detector with sampler, error detector, and counters estimates branch delay difference from the ratio of accumulated sampling errors to clock cycles, enabling robust skew detection and automatic correction without clock recovery or synchronization. The approach exploits the signal-to-noise ratio (SNR) and common-mode noise rejection of differential signaling while tolerating large data-rate variability, supporting high-speed links such as 56-Gb/s PAM4 used in data centers. The technique improves timing integrity, reduces bit-error rate, and simplifies integration with downstream current-mode logic (CML) stages.

26 Claims, 14 Drawing Sheets

(58) Field of Classification Search
CPC .. H04B 10/69; H04B 10/6911; H04B 10/695; H04B 10/6971; H04B 10/6973; H04B 10/6931; H03F 3/08
See application file for complete search history.

(56) References Cited

U.S. PATENT DOCUMENTS

| | | | | |
|---|---|---|---|---|
| 2016/0248521 | A1 | 8/2016 | Streshinsky et al. | |
| 2018/0006732 | A1* | 1/2018 | Pang .................... | H04B 10/691 |
| 2025/0343618 | A1 | 11/2025 | Buchbinder et al. | |

OTHER PUBLICATIONS

International Search Report and Written Opinion mailed Feb. 10, 2026, issued in connection with corresponding International Application No. PCT/US2025/055865 (11 pages total).

* cited by examiner

Figure 1:
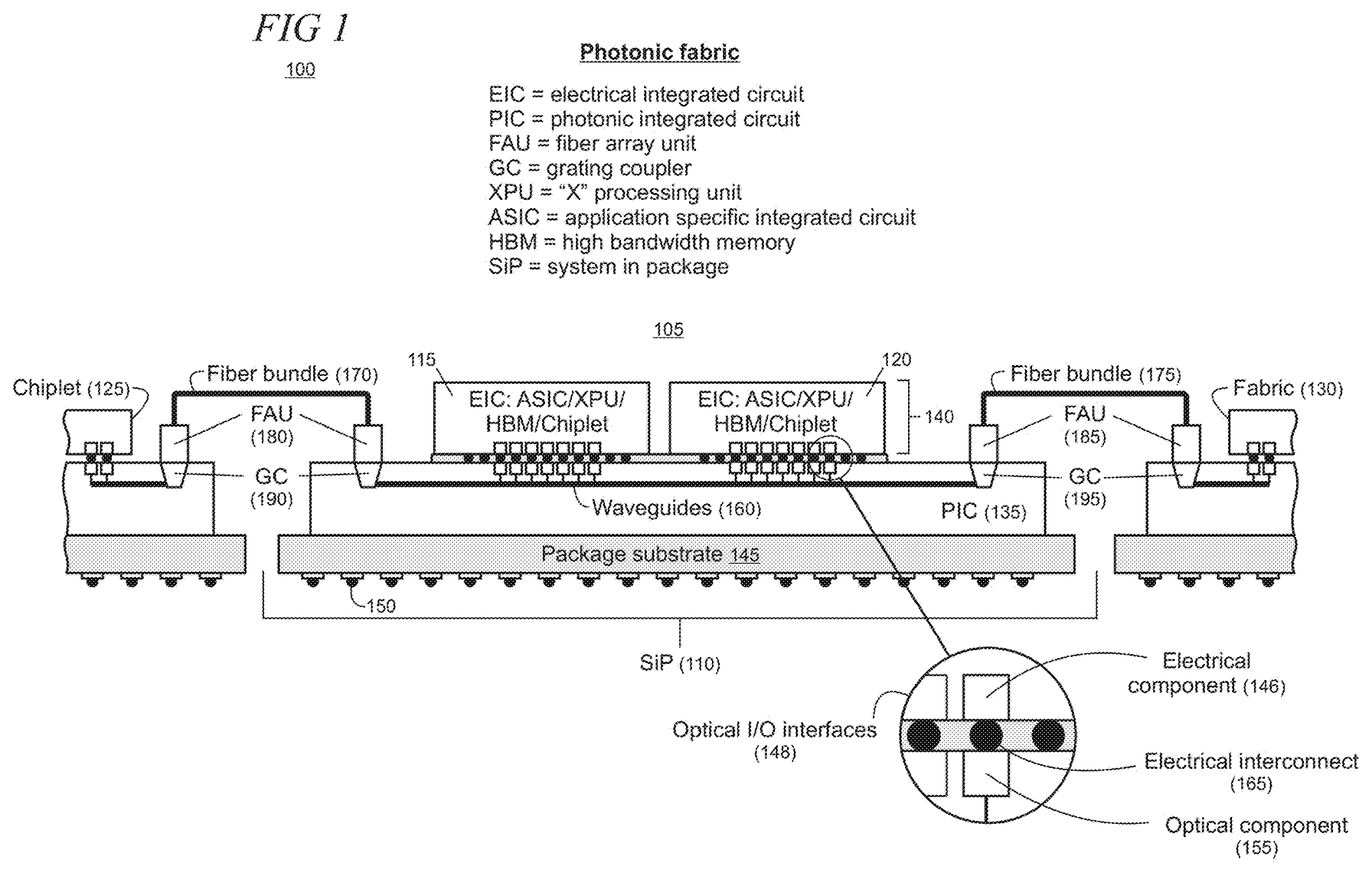

Photonic fabric

EIC = electrical integrated circuit
PIC = photonic integrated circuit
FAU = fiber array unit
GC = grating coupler
XPU = "X" processing unit
ASIC = application specific integrated circuit
HBM = high bandwidth memory
SiP = system in package

105

Chiplet (125)
Fiber bundle (170)
FAU (180)
GC (190)
115
EIC: ASIC/XPU/ HBM/Chiplet
120
EIC: ASIC/XPU/ HBM/Chiplet
140
Waveguides (160)
PIC (135)
Package substrate 145
150
SiP (110)
Fiber bundle (175)
FAU (185)
GC (195)
Fabric (130)
Electrical component (146)
Electrical interconnect (165)
Optical component (155)
Optical I/O interfaces (148)

205

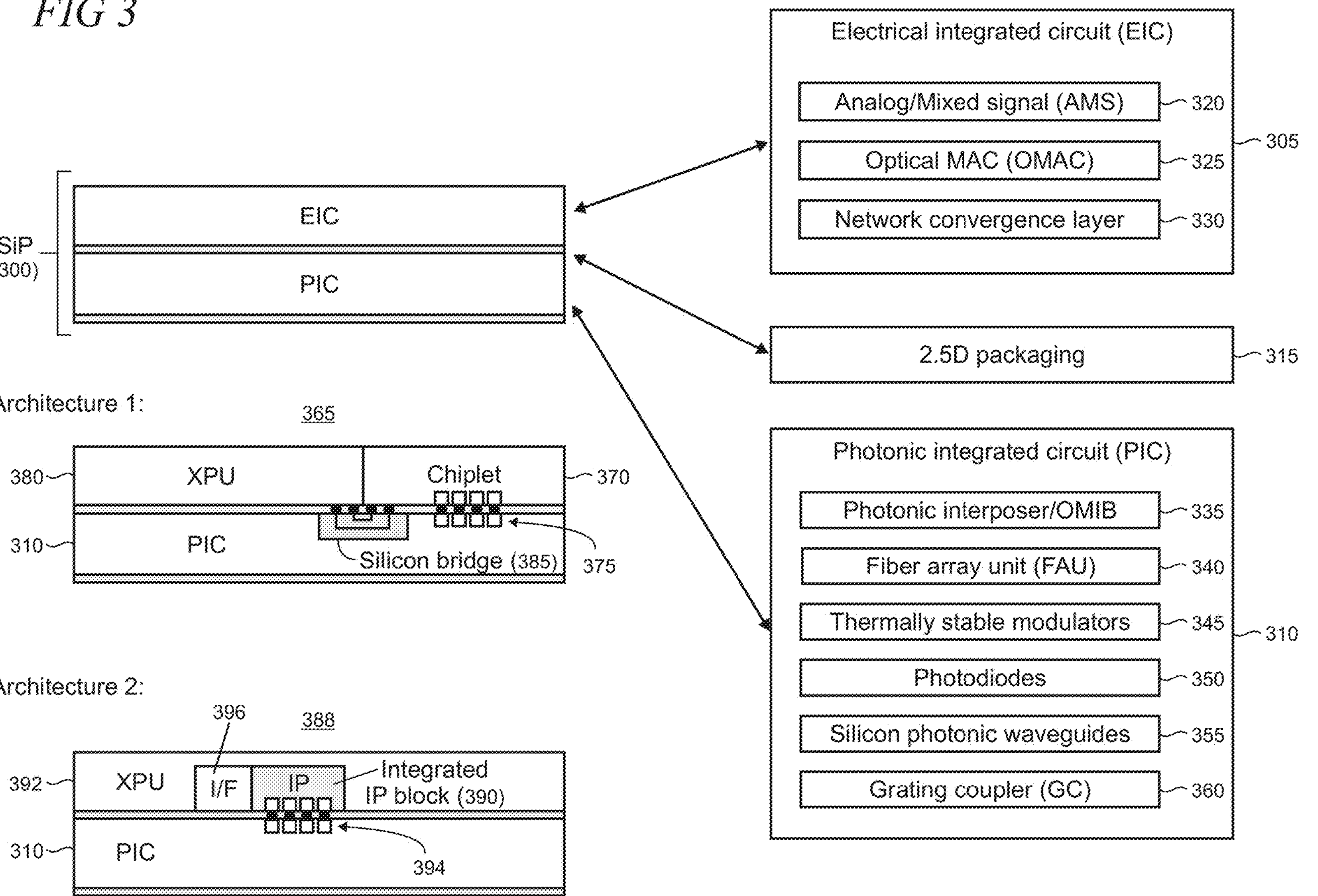
FIG 3
Electrical integrated circuit (EIC)
Analog/Mixed signal (AMS)
320
Optical MAC (OMAC)
325
Network convergence layer
330
305
2.5D packaging
315
Photonic integrated circuit (PIC)
Photonic interposer/OMIB
335
Fiber array unit (FAU)
340
Thermally stable modulators
345
Photodiodes
350
Silicon photonic waveguides
355
Grating coupler (GC)
360
310
SiP (300)
EIC
PIC
Architecture 1:
365
380
XPU
Chiplet
370
310
PIC
Silicon bridge (385)
375
Architecture 2:
396
388
392
XPU
I/F
IP
Integrated IP block (390)
310
PIC
394

*PRIOR ART*

700
Single-ended to differential converter (S2D) (710)
Vbias 735
745
785
Skew control (715)
705
730
720
750
755
Skew corrector
770
B
765
OUT_N
740
A
TIA
742
760
785
Skew corrector
790
775
780
C
OUT_P
Delay detector
794
Controller
796
792
Delay detection and control
S2D with skew control (725)

IN
742
710
S2D
B
770
C
780
OUT_P
OUT_N
Delay (805)

905
CLK
D
Q
CLK
CLK_sampled
CLK_async

1025
$T_{async}$
$N \cdot T_{clk}$
$\alpha T_{clk}$
1020
CLK
(1005)
CLK_async
(1010)
CLK_sampled
(1015)
t
t
t = Control signals (1310)
= Data signals
1305
1300
User interface
Control system
705
1325
1330
Photodiode
720
TIA stage
710
S2D stage
1315
CML stage(s)
920
1320
Signal processing

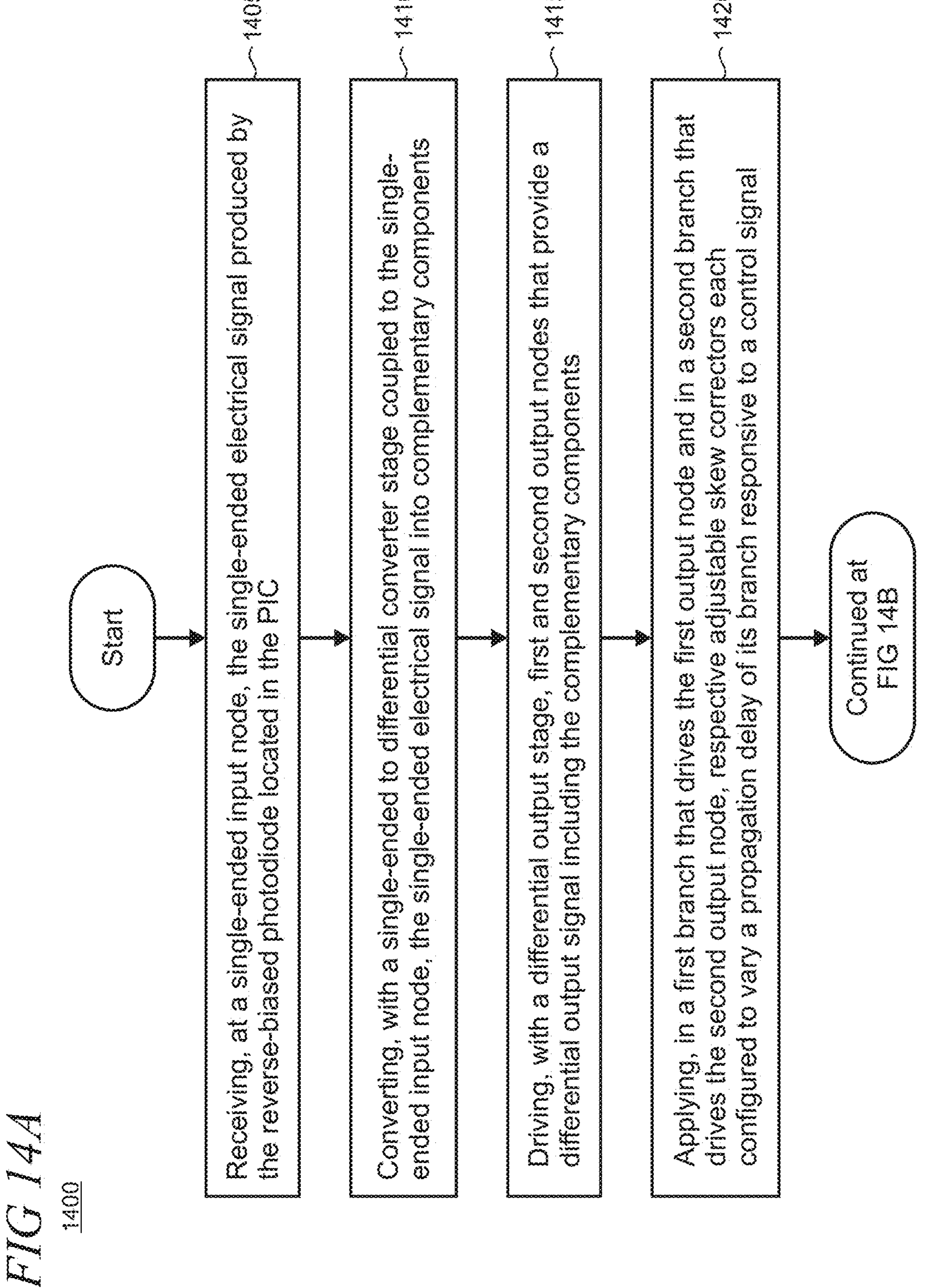
FIG 14A
1400
Start
Receiving, at a single-ended input node, the single-ended electrical signal produced by the reverse-biased photodiode located in the PIC
1405
Converting, with a single-ended to differential converter stage coupled to the single-ended input node, the single-ended electrical signal into complementary components
1410
Driving, with a differential output stage, first and second output nodes that provide a differential output signal including the complementary components
1415
Applying, in a first branch that drives the first output node and in a second branch that drives the second output node, respective adjustable skew correctors each configured to vary a propagation delay of its branch responsive to a control signal
1420
Continued at FIG 14B

Figure 14B:
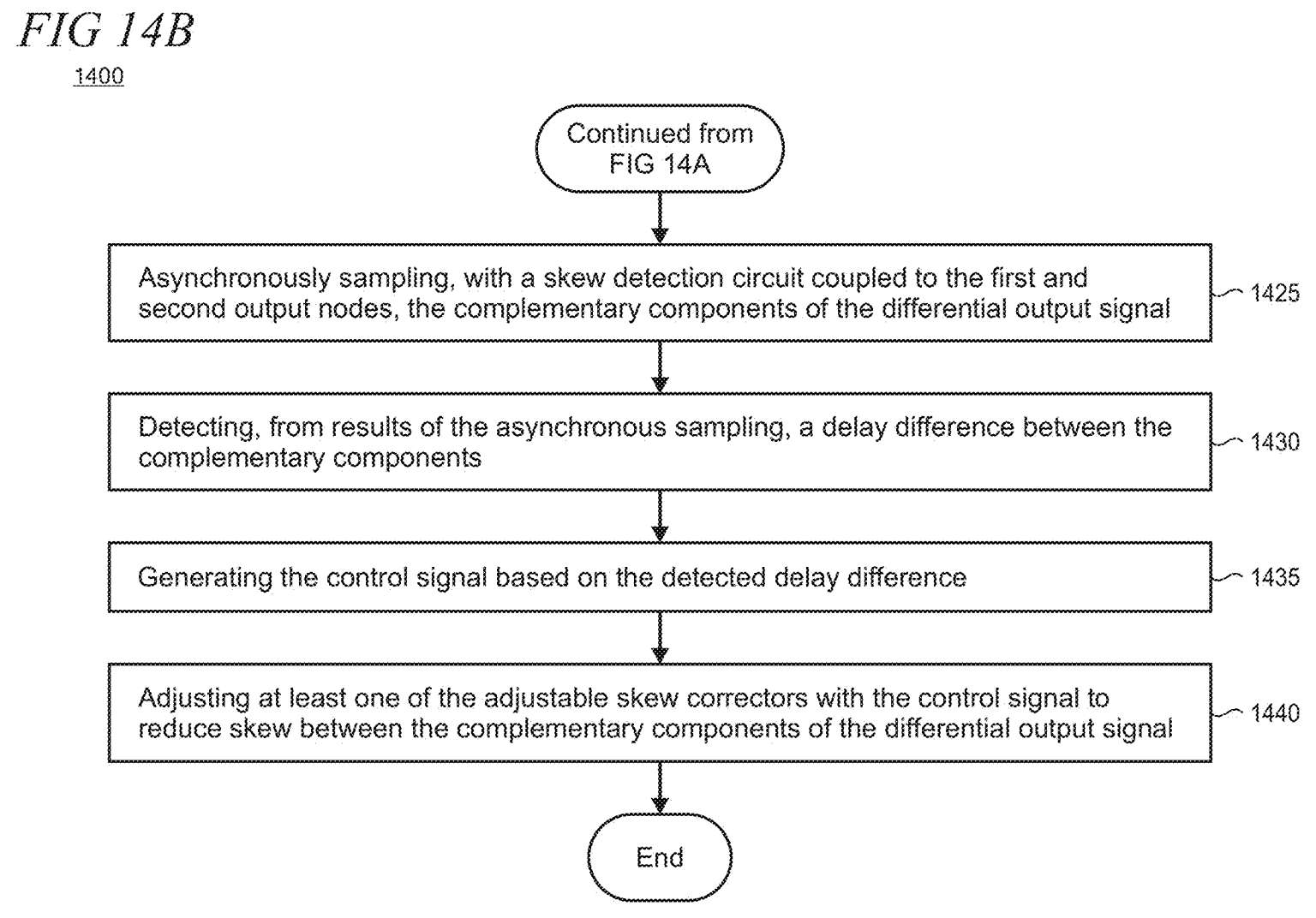

Continued from FIG 14A

1425 Asynchronously sampling, with a skew detection circuit coupled to the first and second output nodes, the complementary components of the differential output signal 1430 Detecting, from results of the asynchronous sampling, a delay difference between the complementary components 1435 Generating the control signal based on the detected delay difference 1440 Adjusting at least one of the adjustable skew correctors with the control signal to reduce skew between the complementary components of the differential output signal End

HIGH-SPEED SINGLE-ENDED-TO-DIFFERENTIAL CONVERTER WITH SKEW CONTROL

BACKGROUND

Optical receivers are widely used in high-speed data links in data centers and similar networked computing systems. In such receivers, a photodiode converts modulated optical signals into electrical form that are subsequently amplified and processed to recover differential data streams for downstream clocking, retiming, and digital processing. In differential high-speed links, PVT (process, voltage, and temperature) variations can cause introduce intra-pair skew (i.e., a relative arrival-time difference between the positive and negative branches of a differential pair). If PVT variations or other causes produce significant skew, the differential signals may not arrive simultaneously, degrading signal integrity and reducing the effectiveness of common-mode noise rejection. At multi-gigabit rates, even picosecond-level skew can produce measurable eye closure and performance impairment.

SUMMARY

Disclosed is a single-ended-to-differential converter circuit implemented in an electrical integrated circuit (EIC) configured for co-packaging with a photonic integrated circuit (PIC) using a system-in-package (SiP) architecture. A reverse-biased photodiode in the PIC generates a single-ended electrical signal that is received at the EIC, converted into complementary components by a single-ended-to-differential converter stage, and delivered as a differential signal by an output stage on respective positive and negative output branches.

To mitigate branch-to-branch skew, the circuit incorporates controllably-adjustable skew correctors in the positive and negative branches and a skew detection circuit coupled to the differential outputs. The skew detection circuit asynchronously samples the differential outputs using an asynchronous clock to detect delay differences without relying on clock synchronization or clock recovery. In illustrative embodiments, a delay detector includes a sampler, an error detector that identifies errors in an expected differential relationship between the outputs, and digital counters that enable skew estimation from a ratio of accumulated detected errors to asynchronous clock cycles.

Asynchronous sampling of the differential outputs to detect branch-to-branch delay differences provides several technical advantages. By accumulating error statistics independent of the clock associated with the single-ended input, the delay detector achieves picosecond-level skew resolution and enables simple, robust integration with downstream stages in the optical receiver such as CML (current-mode logic) stages. This approach avoids costly precision matching and drift-sensitive analog detection schemes, and eliminates the complexity, latency, and power associated with digital detection that depends on clock synchronization or recovery. Control signals derived from the asynchronous measurements drive one or both skew correctors in a closed loop to minimize skew and preserve eye opening for high-speed and multilevel modulation formats such as PAM4 (pulse amplitude modulation with four levels).

By employing differential amplification of the photocurrent from the photodiode, the converter circuit suppresses common-mode noise and produces a differential output representative of the photocurrent with improved signal-to-noise ratio (SNR) and reduced power consumption relative to conventional single-ended-to-differential converter designs. The improved SNR is particularly beneficial for multi-level modulation schemes that are more sensitive to noise and impairments.

The single-ended-to-differential converter circuit is implemented at alternative levels of integration with dies used in 2.5D packaging for the SiP, for example, XPUs (in which "X" stands for any compute architecture that is optimal for a given application), ASICs (application-specific integrated circuits, HBM (high-bandwidth memory), or chiplets. The single-ended-to-differential converter circuit may be alternatively implemented at a package-level as a chiplet having standard die-to-die interfaces or as an analog/mixed signal block co-packaged with other dies in an EIC.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure.

DESCRIPTION OF THE DRAWINGS

FIG. 1 is a cross-sectional elevation view of an illustrative photonic fabric implemented using an optical interconnect technology platform providing connectivity for compute and memory infrastructure;

FIG. 3 shows illustrative details of an SiP for a photonic fabric link using 2.5D packaging;

FIG. 5 is a block diagram of a first illustrative example of a conventional circuit for a single-ended-to-differential converter;

FIGS. 14A and 14B show a flowchart of an illustrative method of operating a single-ended-to-differential converter circuit.

Like reference numerals indicate like elements in the drawings. Elements are not drawn to scale in the drawings.

DETAILED DESCRIPTION

Figure 2:
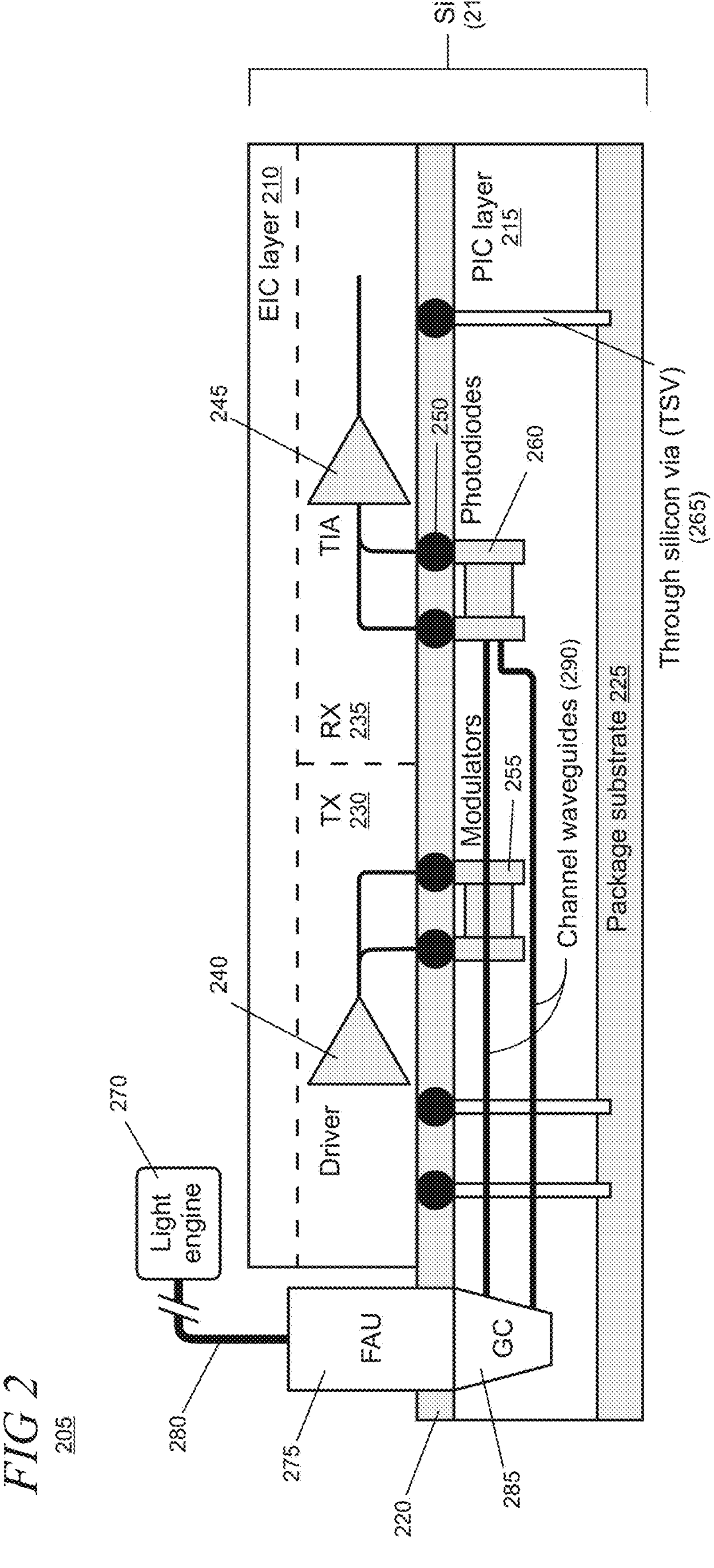
FIG. 2 is cross-sectional elevation view of an illustrative photonic fabric link in a photonic fabric implemented using a system-in-package (SiP) architecture.

As explosive growth in artificial intelligence (AI) model size strains traditional data center infrastructure, there is a huge demand for compute and memory bandwidth/capacity at low latencies. Optical interconnects, co-packaged with compute, have been established as the power efficient, high bandwidth solution needed for the next generation performance scaling. Co-packaged optics solutions are essential to relieve the compute, memory and network system infrastructure chokepoints, but are traditionally limited by compute beachfront. Photonic fabric has emerged as a pioneering optical compute and memory fabric solution for scale-up networking.

Photonic fabric is a subset or architectural implementation within photonic networking. It refers to a highly integrated, scalable, and often reconfigurable optical interconnect layer that enables low-latency, high-bandwidth communication, usually within or between data center racks, server clusters, or even within single-package multi-die systems. Photonic fabric can provide a full-stack solution for interconnecting compute nodes (e.g., XPUs) using photonics, incorporating switching, signal processing, and packaging advancements that together act as the "fabric" for communication.

FIG. 1 is a cross-sectional elevation view of an illustrative photonic fabric 100 implemented using an optical interconnect technology platform. providing connectivity for compute and memory infrastructure. The platform comprises a photonic fabric link 105 between EICs within AI computing systems configured for using light instead of electrical signals for data transfer, which helps overcome traditional electronic interconnect limitations like bandwidth bottlenecks and latency. Use of light further delivers higher energy efficiency, scalability, and modular design benefits. The photonic fabric link 105 implemented, in this illustrative example, as a system-in-package (SiP) 110. The EICs can include, but are not limited to, ASICS, XPUs, HBMs, or chiplets that are used individually or in various combinations.

Using the photonic fabric link 105, photonic input/output (I/O) signals can be transported within an individual die (e.g., within EIC 115 or EIC 120), transported between dies in the same package (e.g., between EIC 115 and EIC 120), transported between packages (e.g., between EIC 115 and chiplet 125, or transported from a package to other portions of the photonic fabric (e.g., from EIC 120 to fabric 130).

The photonic fabric link 105 is implemented as the SiP 110 with a photonic layer (e.g., PIC 135) and an electrical layer 140 (e.g., comprising EICs 115 and 120) using a 2.5D packaging strategy. In some implementations, the PIC comprises an optical multi-die interconnect bridge as described in U.S. Pat. No. 11,835,777, the disclosure of which is incorporated by reference herein in its entirety having the same effect as if set for at length. The PIC may be disposed on or embedded in a package substrate 145.

The package substrate 145 may be a cored or coreless substrate and include one or more layers of an organic or inorganic dielectric material. The package substrate may further include one or more conductive elements such as vias, pads, traces, microstrips, strip lines, redistribution layers (RDL), and the like. The conductive elements may be internal to, or on the surface of, the package substrate.

Generally, the conductive elements of the package substrate 145 allow for the routing of signals through the substrate or between elements coupled to the package substrate. In some applications, the package substrate is implemented, for example, as a printed circuit board (PCB), an interposer, a motherboard, or some other type of substrate. The package substrate typically includes electrical interconnects 150 to enable the SiP to be further integrated into appropriate sub-systems or systems.

The PIC 135 includes active and passive optical components 155 that are optically coupled via a photonic network comprising a plurality of silicon photonic waveguides (representatively indicated by reference numeral 160). The waveguides serve as the physical pathways guiding light signals through passive and active photonic components in the PIC layer of the photonic fabric link, providing the optical interconnect foundation for the photonic fabric 100.

The optical components 155 interoperate with corresponding electrical components 146 in the EICs 115 and 120 in the electrical layer 140 of the photonic fabric link 105 via an electrical interconnect 165 located between the SiP layers. The 2.5D packaging strategy, in combination with the utilization of thermally stable optical components, advantageously enables high bandwidth interfaces for optical I/O to be co-packaged in the center of the EICs in the SiP. This approach frees the peripheral edges of the EIC (i.e., the "beachfront") for electrical I/O.

The electrical components 146 in the EICs 115 and 120 supporting the centrally-located optical I/O interfaces 148 typically are realized as electrical circuits in silicon which may include analog and/or digital components. For example, the implementation in silicon can include analog physical (PHY) layers and/or digital protocol layers arranged for high-speed data transmission and protocol handling.

The photonic fabric 100 is extensibly implementable to provide optical transport, as required, across systems and sub-systems that are spatially separated via optical fiber bundles 170 and 175. The optical fiber bundles are optically coupled to respective fiber array units (FAUs) 180 and 185. Grating couplers (GCs) 190 and 195 provide an optical coupling between optical fibers in the respective FAUs and waveguides 160 in the photonic network in the PIC 135.

FIG. 2 is cross-sectional elevation view of components in an illustrative photonic fabric link 205 that may be deployed in a photonic fabric (e.g., photonic fabric 100 in FIG. 1). The photonic fabric link is implemented as an SiP 210 having a EIC layer 210 that is co-packaged with a PIC layer 215 (the packaging is representatively indicated by reference numeral 220) on a package substrate 225. The EIC layer includes a transmitter (TX) 230 and receiver (RX) 235 respectively comprising one or more modulator drivers 240 and TIAs 245. The drivers and TIAs are coupled, via electrical interconnects (representatively indicated by reference numeral 250), to suitable modulators 255 and photodiodes 260 in the PIC layer.

The EIC with the modulator drivers is physically mirrored and tightly aligned directly above modulators 255 in the PIC, making the distance between driver and modulator exceptionally short compared to conventional approaches. This proximity achieves high signal integrity, minimal latency, and reduced power consumption, resulting in improved bandwidth and a strong SNR without needing complex digital signal processing (DSP) schemes in typical applications. Similarly, the EIC and PIC are located so that the photodiodes 260 are similarly placed very close to the TIAs. This close integration mimics the approach used for the drivers and modulators to minimize parasitic effects and maintain high signal integrity.

Through silicon vias (TSVs) (representatively indicated by reference numeral 265) extending through the PIC layer 215 are provided between the EIC layer 210 and package substrate 225, as shown. The TSVs provide vertical electrical interconnections throughout the SiP 210 to enable high-density, high-bandwidth data transfer between the different layers of the SiP. In some cases, for example, the TSVs are used to provide power delivery paths for the active electrical components in the EIC layer such as the drivers and TIAs.

An external light engine 270 is configured to generate and supply one or multiple wavelengths of laser light that serve as carriers for data transmission using the photonic fabric link 205. In alternative implementations (not shown), the light engine is internal to the SiP 210, for example, by being integrated within the PIC layer 215. The light engine provides an optical signal through an optical interface using components such as an FAU 275 with associated optical fibers 280 and a GC 285. Waveguides 290 can provide multiple optical paths or channels to feed the modulators and/or photodiodes to effect communications to and from the photonic fabric link to support operations of the photonic fabric 100 (FIG. 1).

FIG. 3 shows illustrative details of an SiP 300 for a photonic fabric link 105 (FIG. 1) The SiP 300 includes an EIC 305 and PIC 310 that are co-packaged with advanced 2.5D packaging 315. A 2.5D packaging strategy involves mounting multiple integrated circuit dies side-by-side on an organic interposer substrate that provides high-density interconnections between the dies. This approach enables tighter integration, higher bandwidth, and lower latency compared to traditional PCB-level interconnects while avoiding some complexity of full 3D stacking.

Figure 4:
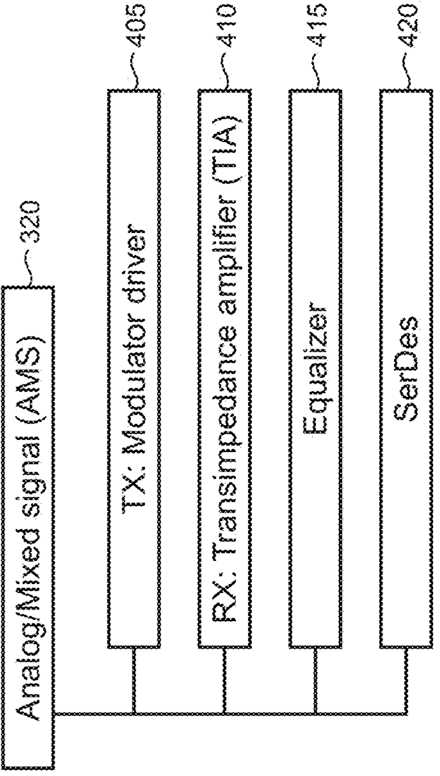
FIG. 4 is a taxonomy of functional components of an illustrative analog/mixed signal (AMS) block.

In an illustrative example, the EIC 305 implements functionalities including an analog/mixed signal (AMS) block 320, an optical MAC (media access control) 325, and a network convergence layer (NCL) 330. As shown in FIG. 4, in an illustrative example, the AMS block 320 respectively implements the TX and RX functions with a modulator driver 405 and TIA 410, an equalizer 415 (implemented, e.g., as an analog circuit and/or digital circuit), and a serializer and deserializer (SerDes) 420 function that is optimized for high-speed optical communications.

Returning to FIG. 3, the optical MAC, or "OMAC" in the EIC 305 may implement link management and/or forward error correction (FEC) functions. Flit generation is also supported by the OMAC which is a process for creating or assembling flits (i.e., flow control units or fixed-size data packets) that are an atomic unit of data transfer at the link level. The OMAC is configured to handle data retransmission using mechanisms similar to traditional MAC layers but adapted for optical networks.

Typically, when a collision or interference is detected during transmission, the OMAC initiates retransmission to ensure data integrity. This can involve stopping the current transmission, backing off for a randomized or scheduled time, and then retransmitting the data packet. The OMAC is further configured for PCS (physical coding sublayer) functionalities that interfaces between the MAC sublayer and PMA (physical medium attachment) in the underlying PHY layer.

The NCL 330 in the EIC 310 provides an adaptation or convergence point within the communication stack implemented in the EIC 305 to harmonize diverse underlying physical and link-layer technologies with higher-layer network protocols. The NCL essentially adapts or translates different link-layer protocols, frame formats, or media characteristics to provide a consistent interface to the upper protocol layers.

For example, in PAM4 schemes where the data rate is effectively doubled by encoding two bits per symbol with four discrete amplitude levels, the NCL provides a critical function to adapt higher-layer protocols to the line coding and modulation format used by PAM4, including handling framing, synchronization, and flow control so that the encoded PAM4 data can be correctly assembled and interpreted by receivers. The NCL further supports multiplexing and efficient packetization to make full use of the doubled data rate PAM4 provides, integrating seamlessly with the physical layer's high-speed transmission capabilities.

The PIC 310 illustratively includes a photonic interposer (e.g., OMIB) 335, one or more FAUs 340, thermally stable modulators 345 such as electro-absorption modulators (EAMs), photodiodes 350, silicon photonic waveguides 355, and one or more GCs 360. These components may be arranged in a similar manner to those shown in FIG. 2 and described above.

The SiP 300 used to implement the photonic fabric link 305 may utilize alternative architectures. The first architecture 365 provides for an EIC to be embodied as a chiplet 370 that discretely incorporates the AMS block, OMAC and NCL functionalities in a discrete device. The optical I/O interfaces 375 are separate from the XPU 380 which communicates with the chiplet 370 via a silicon bridge 385 in the PIC 310 using standardized protocols. Standardized protocols include, for example and without limitation, UCIe (Universal Chiplet Interconnect Express), PCIe (Peripheral Component Interconnect Express), AXI (Advanced extensible Interface), CXL (Compute Express Link), or UAL (Universal Abstraction Layer). Proprietary protocols may also be utilized to optimize performance for specific AI workloads and integration needs.

The second architecture 388 embodies the AMS block, OMAC, and NCL in an IP (intellectual property) block 390 that is directly integrated within an XPU 392. The optical I/O interfaces 394 are centralized in the XPU to free up the beachfront of the XPU for electrical I/O. The XPU communicates with the IP block using an interface (I/F) 396 that supports standardized and/or proprietary protocols.

High-speed optical receivers commonly convert a single-ended photodiode signal in an analog front-end into a differential waveform to improve SNR, common-mode rejection, and immunity to supply and substrate noise. In conventional single-ended-to-differential converter stages, branch-to-branch skew arises from process variation, supply-voltage fluctuation, temperature drift, device aging, and layout-induced asymmetries such as unequal loading, parasitic capacitance, and routing length mismatch. Even picosecond-scale skew can significantly degrade eye opening, create symbol-dependent jitter, and increase error rates, especially for very high data rates such as 56-Gb/s PAM4 typically used in modern data centers.

Existing skew mitigation relies on precision matching, trimming, and clock-synchronous calibration. Analog solutions (e.g., tight device matching, analog delay tuning) are costly in area and power and are sensitive to drift. Digital approaches typically require clock recovery, high-rate sampling, or DSP (digital signal processing) resources, adding latency and complexity while relying on accurate synchronization. As a result, robust, low-overhead detection and correction of differential skew in optical receivers remains challenging.

Figure 5:
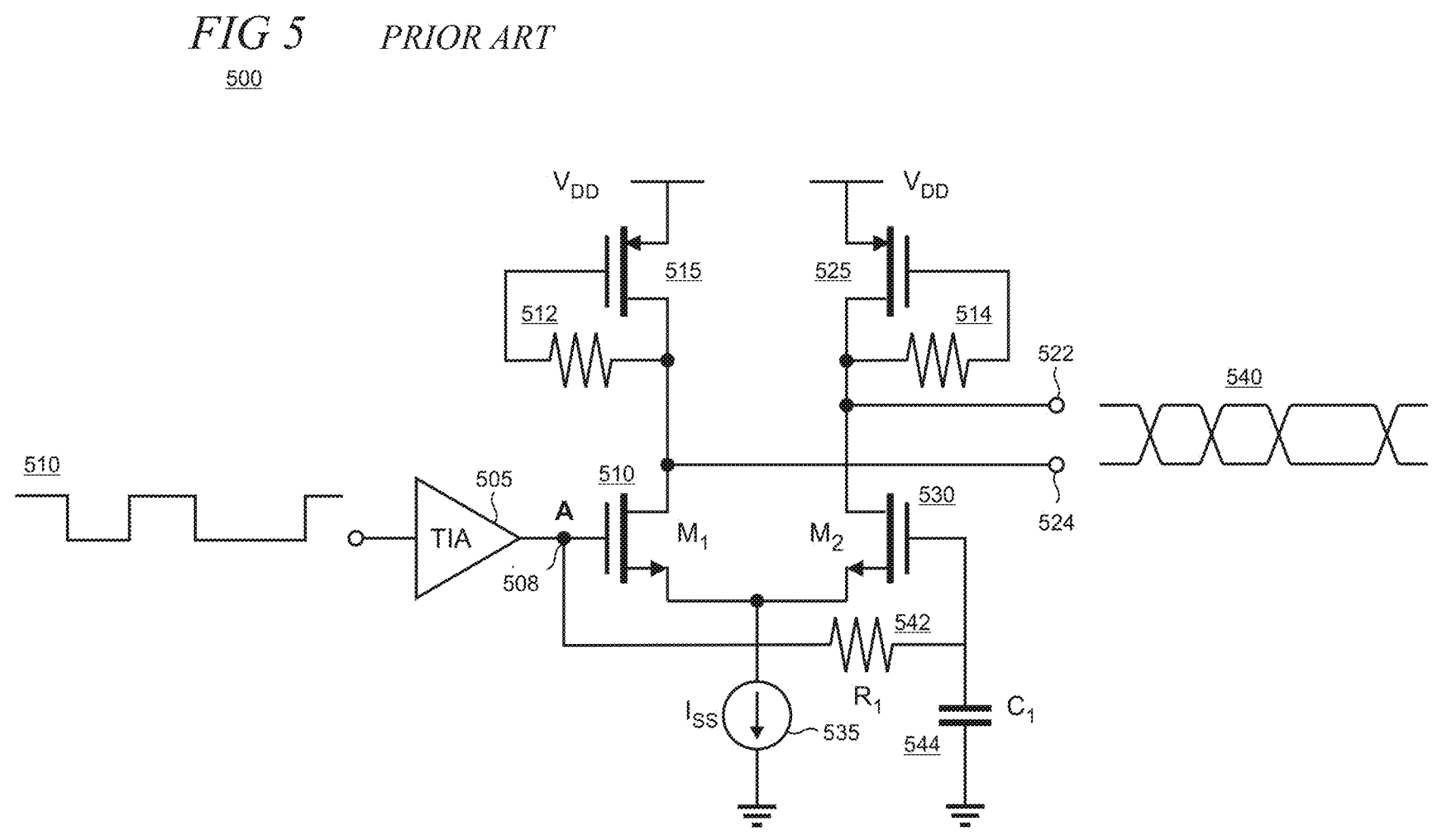

FIG. 5 is block diagram of a first illustrative example of a conventional single-ended-to-differential converter circuit 500. The circuit includes a transimpedance amplifier (TIA) 505 that is arranged to receive a single-ended electrical signal 510 from a photodiode (not shown). By being single-ended, the TIA takes the current from the photodiode (typically from its anode or cathode, depending on biasing) and converts it to a voltage at a single output pin. Only one end of the photodiode is sensed, with the other typically wired to ground or a bias voltage. The output from the TIA is referenced to this common point, producing a voltage proportional to the incident light on the photodiode.

The TIA 505 outputs a voltage at an output node A (indicated be reference numeral 508) which serves as an input to the transistor $M_1$ (510). $M_1$ and $M_2$ (530) are NMOS transistors configured as a differential pair. $M_2$ receives a reference or complementary signal. Both the drains of $M_1$ and $M_2$ connect to load resistors (512, 514) and PMOS load transistors (515, 525), which are biased by $V_{DD}$. The sources of $M_1$ and $M_2$ share a common connection through a current source ($I_{ss}$, 535), setting the tail current for the differential pair. The output nodes (522 and 524) represent the differential outputs for signal 540. The output nodes are driven by the differences in currents through $M_1$ and $M_2$. Additional filtering and stabilization are provided by resistor $R_1$ (542) and capacitor $C_1$ (544) at the tail of the differential pair.

In an ideal single-ended-to-differential converter, the output swing from single-ended to differential is doubled, yielding a 6 dB (or factor of two) voltage gain over a single-ended output for the same input swing. By contrast, in the converter circuit 500 in FIG. 5, only the path through $M_1$ (510) is actively driven by the output of the TIA 505. The $M_2$ (530) leg acts as a static or complementary path which does not mirror the signal dynamically. As a result, the full differential swing is not utilized, causing a loss of the expected 6 dB “push-pull” gain advantage because both outputs are not equally and oppositely engaged by identical input drive.

In a true differential pair under differential drive, both branches dynamically share current, and only the signal-induced difference determines AC swing. This is efficient because biasing is actively used for signal transmission. In the converter circuit 500, the $M_2$ branch is biased mainly for balance, not for an active input signal, leading to continuous current draw that does not contribute to signal amplification or output swing. This balancing approach results in unnecessary power dissipation, as current in the static (or reference/complementary) branch is essentially wasted from a signal-processing point of view.

The transfer function from input to each output can be asymmetric due to the topology’s reliance on the TIA 505 actively driving only one side ($M_1$) while the second side ($M_2$) is set by a reference or fixed bias and does not respond equally to input fluctuations. Thus, the two outputs (522 and 524) have different voltage swings, baseline shifts, or responses to the same input, leading to mismatches, such as differences in output amplitude, offset, or duty cycle, that can degrade common-mode rejection and noise immunity. Such asymmetric output can cause issues for downstream components in the optical receiver where precise differential signaling (i.e., equal and opposite swing) is required.

Figure 6:
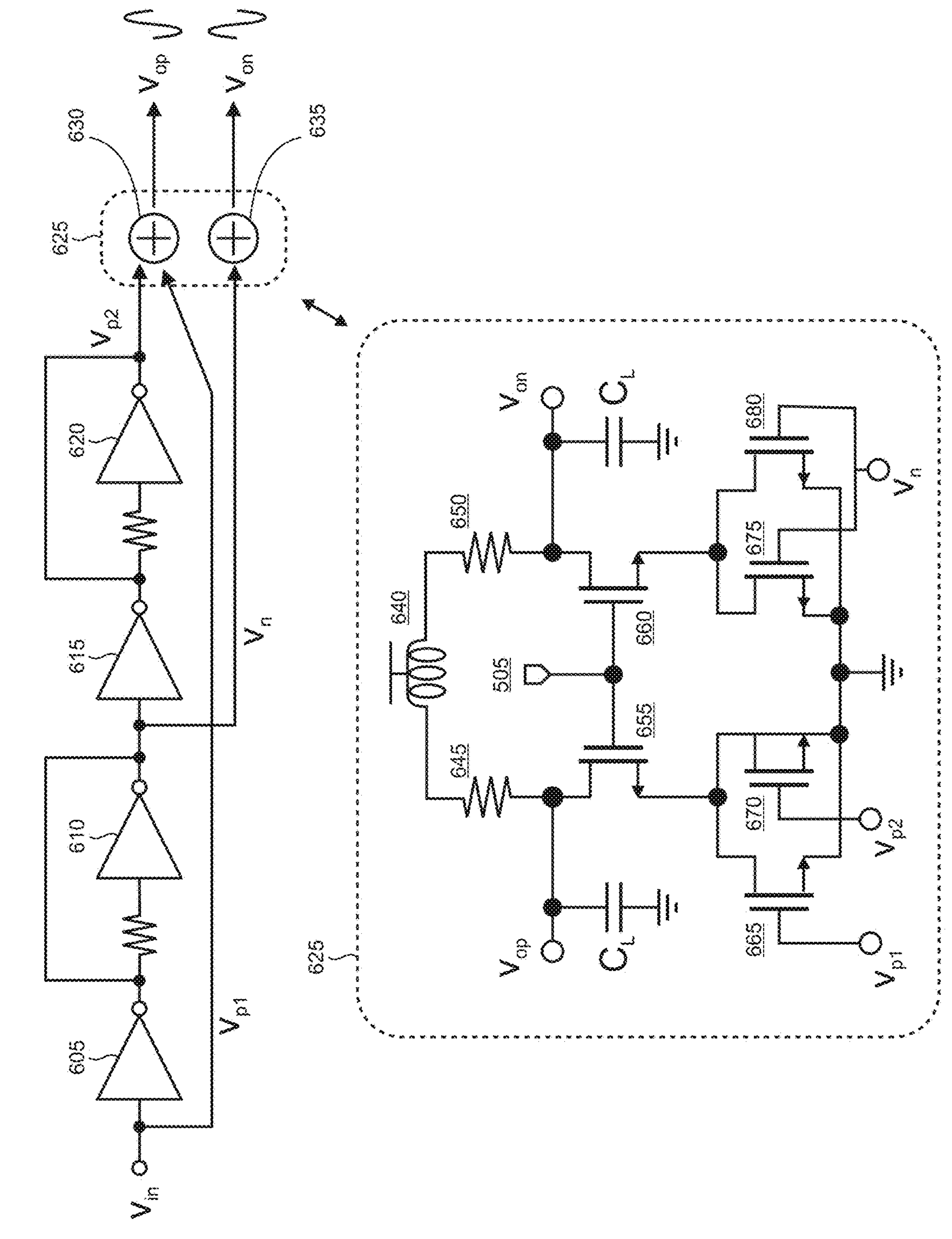
FIG. 6 is a block diagram of a second illustrative example of a conventional circuit for a single-ended-to-differential converter.

FIG. 6 is a block diagram of a second illustrative example of a conventional circuit 600 for a single-ended-to-differential converter. It uses multiple stages of buffers and interpolation logic to generate precise, balanced differential outputs $V_{on}$ and $V_{op}$ from a single ended input Vin. The top portion of the diagram shows a chain of buffers amplifiers (605, 610, 615, and 620) with series resistors for generated voltage points $V_{p1}$, $V_{p2}$, and $V_n$. Such intermediate voltages are derived from the single-ended input Vin and are distributed to the fully differential output stage shown in the lower portion of the drawing.

Circuit 600 comprises a current-sourced differential pair (655 and 660) loaded by resistors (645, 650) and a center-tapped inductor 640 which are configured to enable low-impedance, high-frequency operation. The left and right output nodes, $V_{on}$ and $V_{op}$, are both connected through load capacitors CL to appropriate power or ground nodes. The gates of the input transistors (655 and 660) are driven by the previously generated intermediate voltages, $V_{p1}$, $V_{p2}$, and $V_n$, routed through cascaded pairs of MOSFET switches (665, 670, 675, and 680). This topology enables accurate interpolation between the buffered input points, providing finer control of the differential outputs.

Circuit 600 implements an interpolation approach where, instead of feeding the single-ended signal to one side of a differential pair and grounding the other (which causes gain loss and asymmetry), it utilizes multiple interpolated voltages derived from buffered stages. By mixing and distributing input transitions into several points across MOS switches, the circuit interpolates between them, driving both sides of the differential output actively. The results of the interpolation generate two outputs $V_{on}$ and $V_{op}$, each derived from weighted combinations of the input and its interpolated voltages. This architecture minimizes gain loss and improves symmetry. The arrangement of buffer stages and matched resistors helps ensure that the transfer function from Vin to $V_{op}$ and $V_{on}$ is highly linear and symmetric, optimizing common-mode rejection and reducing distortion.

Circuit 600 improves differential gain and symmetry as the interpolation logic allows both outputs to be driven by signal content, essentially reclaiming the full differential gain and avoiding static bias on one side. Multiple interpolation points enable smoother transitions and less jagged signal behavior compared to basic single-ended-to-differential conversion. It overcomes traditional drawbacks associated with single-ended-to-differential conversion by using interpolation and parallel signal-processing paths to provide high bandwidth and minimized mismatches in terms of magnitude and phase.

While circuit 600 has some technical advantages, as noted above, it also has some drawbacks. For example, the unity gain cells implemented in the inverting stages in the interpolation chain (605, 610, 615, and 620) can consume significant static and dynamic power, especially when multiple cells are cascaded or paralleled for fine interpolation. In interpolation-based designs, each unity cell must remain active to maintain its output signal level, and total power use accumulates rapidly, especially as resolution or interpolation granularity increases.

Similarly, the summing stages in the circuit can present a significant power draw. The summers are constructed from multiple transistors that operate in parallel or as weighted summing nodes, each receiving a share of the interpolated signal levels from the preceding stages. The summers must be able to linearly and rapidly combine multiple active signals, which inherently requires continuous bias currents and multiple active devices. The combined static and dynamic current for all of these contributing paths can add up, particularly at high speeds or with more interpolation taps, leading to a potentially large overall power draw from the summing portions as well as from the interpolation stages themselves.

While interpolation spreads device mismatches (such as transistor threshold and device parameter variation) over multiple stages, it does not actively correct or calibrate offsets, gain differences, or nonlinearities arising in these paths. Any inherent mismatch in the inverters, resistors, or intervening signal cells will propagate into the output interpolation. This can lead to amplitude errors, offset, or duty cycle imbalance that cannot be finely tuned or compensated once the device is fabricated. By contrast, architectures with calibration or feedback mechanisms can automatically compensate for such errors. Circuit 600 relies only on passive averaging/interpolation, so mismatch errors remain which may degrade accuracy, symmetry, or noise immunity.

Figure 7:
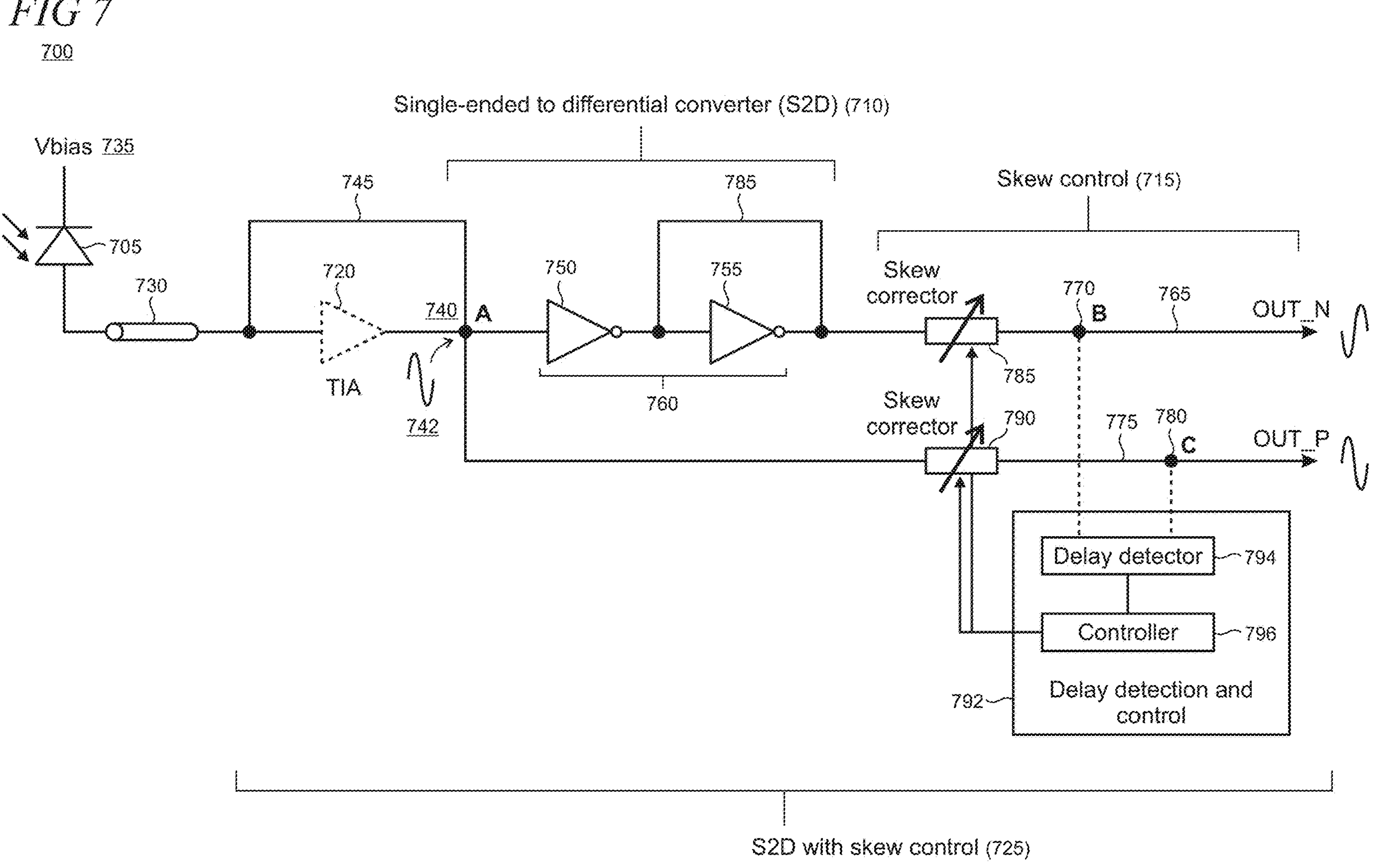
FIG. 7 is a block diagram of an illustrative optical receiver circuit including a photodiode, a single-ended-to-differential converter, and delay detection and control, arranged in accordance with the present principles.

FIG. 7 is a block diagram of an illustrative optical receiver circuit 700 including a photodiode 705, a single-ended-to-differential converter (S2D) 710, and skew control 715, arranged in accordance with the present principles. A TIA 720 is utilized in this illustrative implementation which converts photocurrent from the photodiode into a voltage signal. The TIA stage converts the photodiode's very low-level current signal into a voltage signal with controlled gain and bandwidth which is typically important for maintaining signal integrity and noise performance. The S2D circuit is downstream from the TIA, in this illustrative embodiment, and converts the single-ended voltage signal from the TIA into a differential voltage signal. This separation of functions helps optimize each stage: the TIA focuses on low-noise current-to-voltage conversion with appropriate feedback and stability, while the differential stage focuses on maximizing common-mode noise rejection and driving differential inputs for subsequent circuitry In alternative implementations, the functionality of the TIA 720 may be integrated into the S2D 710 portion of the circuit 700. For example, the TIA and differential conversion functions can be combined into a single stage by using a fully differential amplifier configured as a TIA.

The differential architecture for the TIA stage 615 provides significant improvement to SNR compared with conventional single-ended designs. The output signals OUT_P and OUT_N swing in opposite directions so that the effective signal amplitude across the differential pair is twice that of a conventional single-ended output. If each output swings±1V, the total differential swing is 2V, yielding a 6 dB improvement in voltage SNR compared to a single-ended design for the same noise floor.

Differential signaling naturally rejects common-mode noise compared to conventional single-ended designs. Any interference (such as from power supply fluctuations or electromagnetic coupling) that appears equally on both signal lines is canceled out at the differential amplifier input or in subsequent stages. This dramatically reduces susceptibility to electromagnetic interference (EMI) and power supply noise.

As differential pairs carry equal and opposite currents, the return currents are balanced, minimizing ground noise and crosstalk between channels which is commonly a problem in densely packed optical front-end designs. Differential amplifiers can handle larger total signal swings while maintaining headroom on each output, thus they achieve higher dynamic range without saturation. Additionally, the differential structure allows operation at higher data rates and clock frequencies than a single-ended receiver of comparable power. With symmetrical outputs and constant current drive, differential signaling introduces less timing noise (jitter) and offers cleaner transitions, essential for high-speed optical and mixed-signal systems.

As discussed above with reference to FIGS. 1-3, in illustrative embodiments, the photodiode is disposed in a PIC. The remainder of the circuit, including the S2D 710 and skew control 715 (collectively indicated by reference numeral 725), is disposed in an EIC. The photodiode 705 and S2D with skew control 725 are coupled by an electrical interconnect 730 when the PIC and EIC are co-packaged in an SiP.

The photodiode 705 is reverse biased by Vbias 735. When exposed to incident light (e.g., laser light from a light engine that is modulated by a modulator in a TX in a photonic fabric), the photodiode generates a current that is proportional to the optical power of the incident light. The photocurrent from the photodiode is received at the TIA 720 which converts the current to a voltage at the output node A (indicated by reference numeral 740). Elements (e.g., resistors, capacitors, or direct connections) in a negative feedback path 745 determines the operating behavior of the TIA, for example, by setting closed-loop gain, determining frequency response, and controlling stability and bandwidth of the TIA. As shown, the TIA produces a single-ended signal 742 at node A at the input to the S2D 710.

The S2D 710 comprises amplifiers 750 and 755 arranged in a cascaded pair 760 in the negative branch 765 of the circuit that provides an OUT_N (i.e., inverted) component of the differential signal at node B (770). Amplifier 750 receives the single-ended signal at node A and inverts it, producing a 180 degree phase shift to generate the complementary output signal component. Amplifier 750 buffers the input to isolate the input node A from downstream loading effects. Amplifier 755 maintains the inverted polarity and drives an adjustable skew corrector 785 on the negative branch. A negative feedback path 785 includes suitable elements (e.g., resistors, capacitors, or direct connections) to set closed-loop gain and provide a linear output within a predetermined frequency range.

The positive branch 775 of the circuit provides the OUT_P (i.e., positive/non-inverted) component of the differential signal at node C (780). The signal path is taken directly from the input at node A to preserve the non-inverted characteristic of the single-ended input signal which is fed to an adjustable skew corrector 790.

The differential output nodes B and C (770 and 780) are coupled to a delay detection and control circuit 792. The combination of the circuit 792 and adjustable skew correctors 785 and 790 comprise the skew control 715 portion of the optical receiver circuit 700, as shown. The delay detection and control circuit 792 comprises a delay detector 794 and a controller 796. The delay detector is coupled to the differential output nodes and the controller. The controller is coupled to the adjustable skew correctors 785 and 790.

Figure 8:
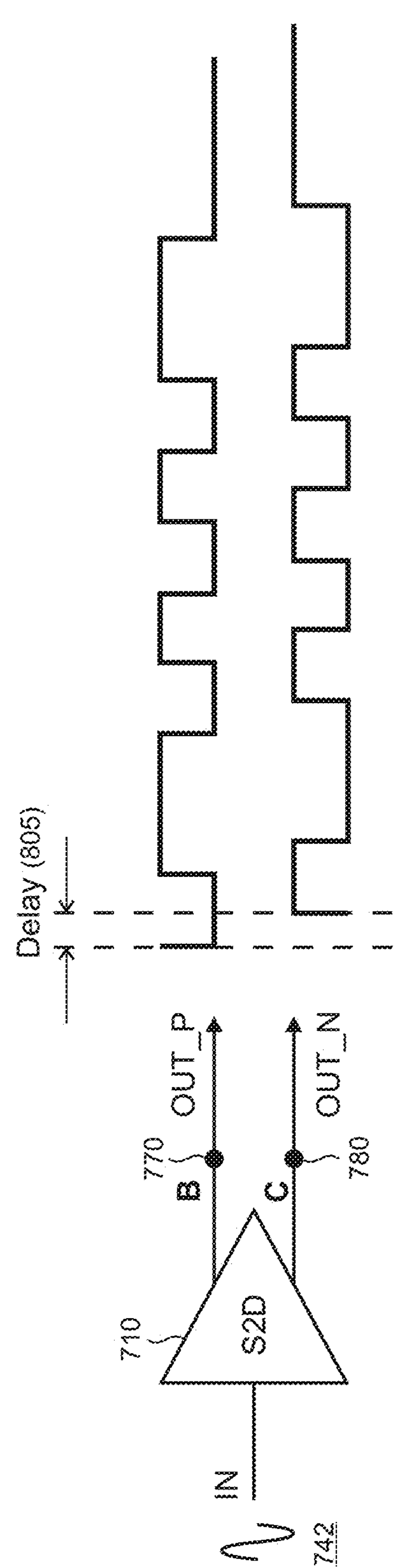
FIG. 8 shows an illustrative example of delay error in a differential signal output in an optical receiver.

The delay detector 794 is configured to detect delay error 805 which is the difference in arrival times between the components OUT_P and OUT_N of the differential signal at the output nodes B and C (770 and 780), as shown in FIG. 8. Skew in a differential amplifier context refers to the time difference between the transitions of the two differential output signals. Skew is critical because ideally, the two signals should transition simultaneously. A large skew means the differential signals are not aligned, so the crossing point moves away from the sampling instant, closing the eye and reducing detection margin. This leads to more transmission errors, increased jitter, and reduced overall reliability in high-speed communication links. Minimizing skew is therefore essential for enabling robust, error-free, and high-performance optical receiver operation with differential signaling.

Skew can result from the difference in propagation delays in different parts of the optical receiver circuit 700. PVT (process, voltage, temperature) variations in high-speed optical receiver circuits cause skew by creating mismatches in propagation delay between differential signal paths, affecting timing alignment and ultimately degrading signal integrity. Process variations may include, for example, differences in transistor geometry, threshold voltage, and parasitic factors may lead to unequal delays in matched paths. For example, one side of a differential pair might have slightly higher resistance or capacitance due to lithography or doping variation, causing an offset in arrival times at the optical receiver.

Voltage variations may include, for example, fluctuations in supply voltage affect the speed of logic gates and analog buffers, often unequally between differential branches. As supply dips or rises, circuit response changes, introducing delay mismatch that can vary as the power system loads or as other blocks on-chip switch.

Temperature variation may include, for example, temperature impacts on threshold voltage and leakage which can cause shifts delay. If the two branches of a differential signal experience different thermal environments (e.g., due to layout asymmetry or hot spots), timing drift and skew may develop or worsen over time.

High-speed optical receiver circuits, which operate in the GHz frequency range, typically require precise timing alignment of the differential signal components. For example, for 56 GHz line rates, alignment in the range of picoseconds is often required to achieve an acceptable bit error rate (BER). Skew, whether induced by PVT or other factors, can disrupt signal alignment to increase jitter and reduce the eye opening window that determines the decision threshold of the optical receiver.

The delay detector 794 (FIG. 7) uses asynchronous sampling to detect the delay error 805 shown in FIG. 8. Asynchronous sampling is a foundational technique that is commonly utilized in clock domain crossing (CDC) applications when signals must move between unrelated or unsynchronized clock domains. CDC may be performed by sampling the signal from one clock domain using a flip-flop (or a series of flip-flops) that is clocked by the destination domain's clock.

Figures 9, 10:
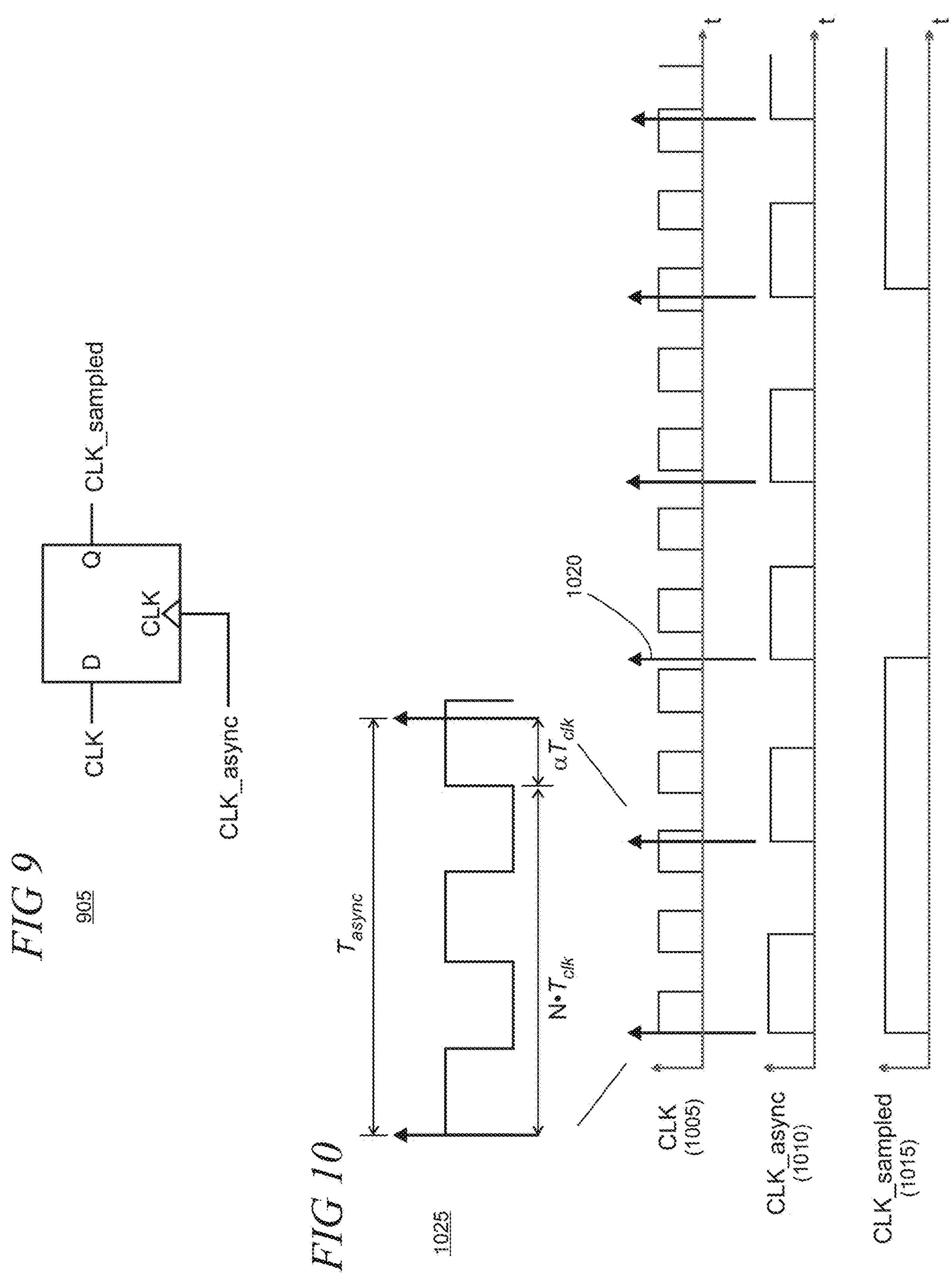
FIG. 9 shows an illustrative example of asynchronous sampling using a D-type flip-flop.
FIG. 10 shows examples of different clock signals used in an illustrative example of asynchronous sampling.

FIG. 9 shows an illustrative example of asynchronous sampling using a D-type flip-flop 905. CLK is the main clock driving the flip-flop at the D input. The input CLK_async is an asynchronous clock signal that is not synchronized with the main clock CLK. Whenever a rising edge of CLK_async is received at the flip-flop the value of CLK is sampled at that time. The sampled value is held at the Q output for CLK_sampled until the next leading edge of the CLK_async is received and the process repeats.

FIG. 10 shows timelines for CLK, CLK_async, and CLK_sampled (as indicated by reference numerals 1005, 1010, and 1015). Sampling events triggered by the rising edge the CLK_async signal are indicated by the arrows (representatively indicated by reference numeral 1020). As shown in the enlarged view 1025, the period T_async of CLK_async is selected to be an integer multiple N of the period T_clk of CLK plus a fractional portion of T_clk, $\alpha$T, which is a non-zero timing offset. Thus, $T\_async = N \cdot T\_data + \alpha T$.

Selecting the period of CLK_async to be an integer multiple of the CLK period plus an small offset ensures that all possible timing relationships between CLK and CLK_async are observed. Using this period provides for the phase relationship between the clocks to move through all possible alignments. When the periods are exact multiples, the edge relationships repeat every few cycles. Using the small timing offset $\alpha$T ensures that more cycles are needed before the clocks return to their initial alignment. Such slow sampling precession enables the sampling to effectively test all the edge placements in between instances of alignment between CLK and CLK_async. In some implementations, a can be modulated (i.e., not maintained at a constant value), as needed, to enhance the observations of the timing relationships between CLK and CLK_async.

Figure 11:
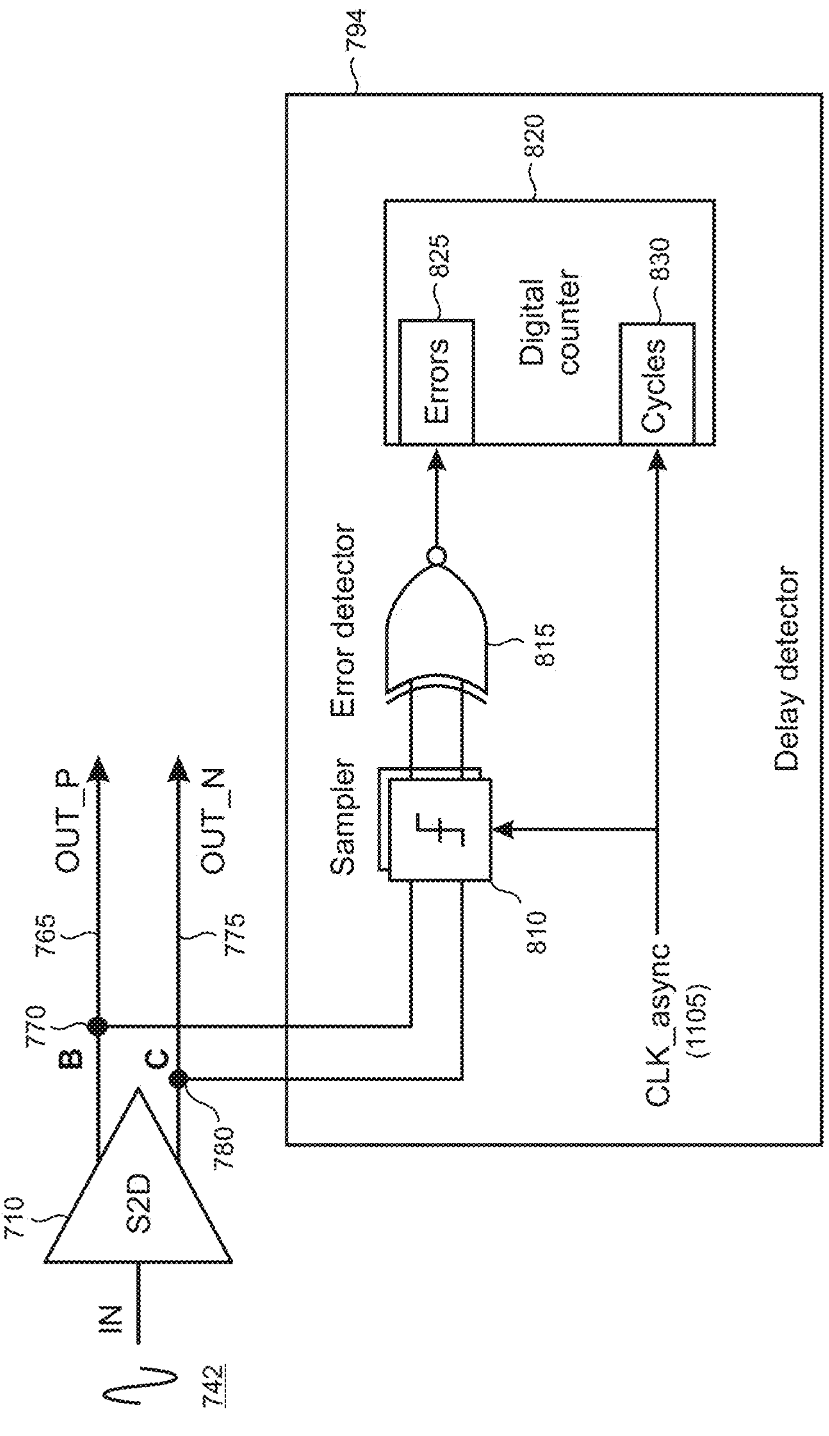
FIG. 11 shows an illustrative example of a delay detector arranged in accordance with the present principles.

FIG. 11 shows an illustrative example of the delay detector 794 arranged to detect delay errors between the complementary component OUT_P and OUT_N in the differential signal using asynchronous sampling, in accordance with the present principles. The delay detector employs an asynchronous clock, CLK_async 1105, that is operated independently and in non-synchronized manner with a clock, CLK (not shown), associated with the single-ended input signal 742. The delay detector includes a sampler 810 which is coupled to the differential output nodes 770 and 780. The sampler output is coupled to an error detector 815 and is configured to receive CLK_async as a trigger for a sequence of sampling events that occur over time.

When triggered by a rising edge of CLK_async, the values of the OUT_P and OUT_N are sampled by the sampler 810, and sent to the error detector 815. The error detector detects delay errors by checking if the outputs are at expected logic levels corresponding to zero skew. If there is skew, then for certain samples, one output may have transitioned while the other has not yet, leading to logic errors (i.e., mismatches) between the outputs. Thus, if the respective sampled values for a given sampling event are not complementary (i.e., mirrored), as expected with a differential output, then an timing error is detected.

Figure 12:
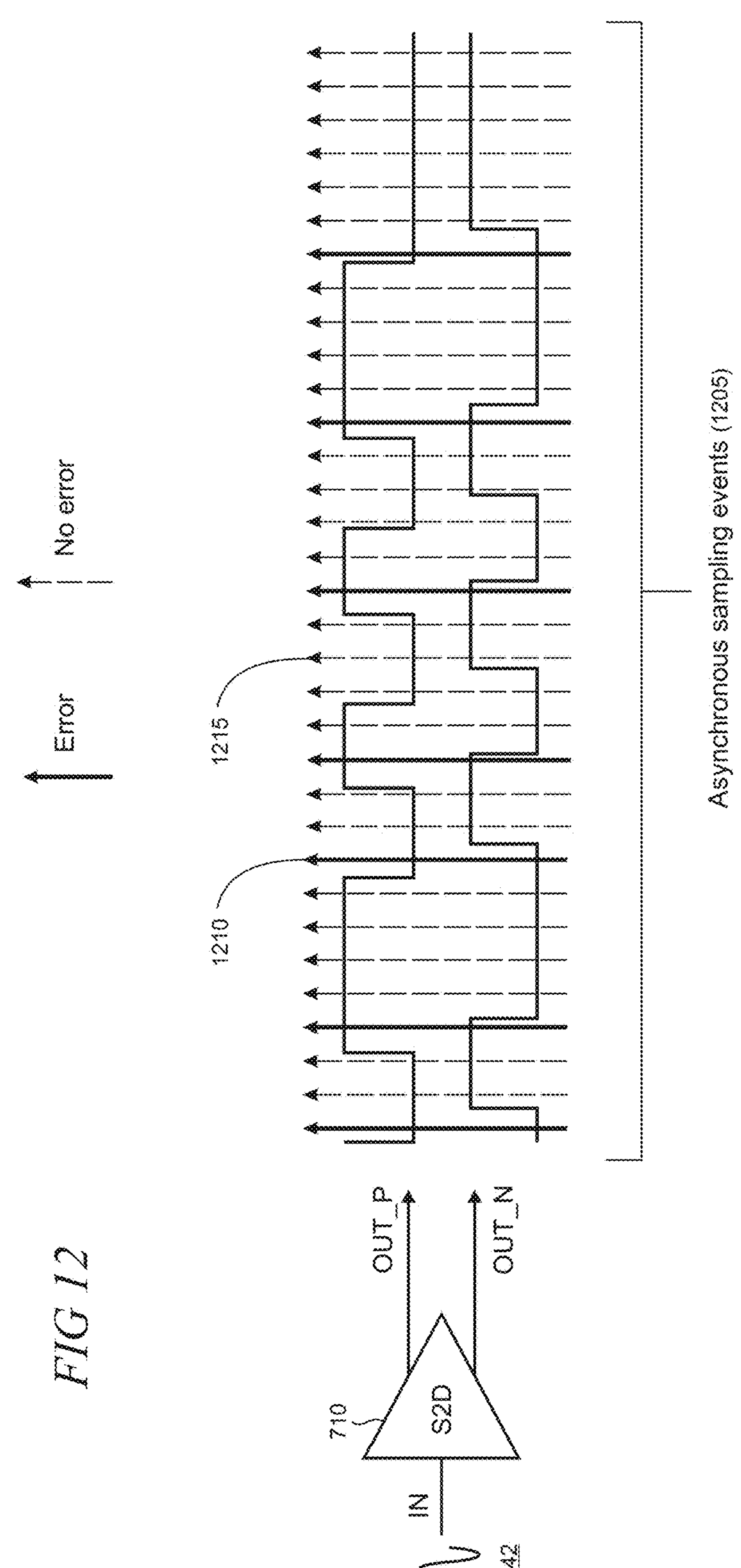
FIG. 12 shows asynchronous sampling implemented by a sampler in a delay detector in accordance with the present principles.

FIG. 12 shows illustrative waveforms for OUT_P and OUT_N differential components that are timed based on a clock, CLK, used to generate for the singled-ended input signal 742. Asynchronous sampling events (collectively indicated by reference numeral 1205) are individually shown by the arrows. For some asynchronous sampling events 1205, the values of OUT_P and OUT_N are not complementary. Thus, the error detector will flag such events as an error. Errors are indicated by a solid arrow. If a sampling event results in sampled values being complementary, then the error detector will not flag an error. Events having no errors are indicated by a dashed arrow. For example, asynchronous sampling event 1210 represents an error because the sampled values for OUT_P and OUT_N are both low (i.e., they have the same value). Asynchronous sampling event 1215 has no error because the value for OUT_P is low while the value for OUT_N is high (i.e., they are complementary/mirrored values).

The period of CLK_async is set as an integer multiple of the period of CLK plus a small offset, as in the illustrative example shown in FIG. 10 and discussed in the accompanying text above. The slow precession of the sampling events will, over time, cover every possible timing delay between OUT_P and OUT_N. As a result, the sampler eventually observes every possible skew amount between the differential components. Such sampling strategy reveals even very small differences in timing. In an illustrative embodiment, the delay detector using asynchronous sampling, in accordance with the present principles, is able to detect less than a 2 picosecond delay error.

Returning to FIG. 11, for a given time period for which delay detector 794 is utilized, the number of errors 825 captured at the error detector 815 are counted at a digital counter 820. The counter also counts the number of cycles 830 for CLK_async that occur during the time period. Skew in the differential output can be approximated by the expression: Delay difference $\propto N_{capture}/N_{cycle}$ when $N_{cycle}>>0$, where $N_{capture}$ is the number of counted errors and $N_{cycle}$ is the number of counted asynchronous clock cycles.

The skew approximation is valid because the number of errors counted over a large number of asynchronous clock cycles reflects how often a sampling event falls within a skew window (i.e., the time interval in which the differential outputs are out of alignment). Taking the ratio of the number of error to the total number of asynchronous clock cycles gives an estimate of the fraction of the clock period that corresponds to this skew window. Multiplying this ratio by the asynchronous clock period (or averaging over enough cycles) yields an approximation of the skew. The calculation takes advantage of asynchronous sampling randomness to measure skew without requiring complex time domain measurements. It uses the error count as a proxy for the relative time difference between differential output transitions.

Returning to FIG. 7, the detected delay difference from the delay detector 794 is provided to the controller 796 in the delay detection and control circuit 796. The controller generates suitable control signals based on the detected delay difference. One or more control signals are passed to one or both of the skew correctors 785 and 790. Responsively to the control signals, one or both of the skew correctors are adjusted to reduce the skew between the OUT_P and OUT_N differential components.

The adjustable skew correctors 785 and 790 may be realized using a variety of technologies depending on the requirements of a particular implementation of the present principles. For example, skew correction devices used to compensate for skew in differential outputs of optical receivers in high-speed communication systems include variable delay lines, programmable delay elements, replica biasing, offset compensation circuitry, and digital signal processing (DSP) systems that calibrate or adjust data streams.

Variable delay lines and programmable delay elements may be implemented using integrated circuits and/or discrete devices that tune the delay of each branch 765 and 775 independently, for example, using digitally controlled delay cells or analog tuning blocks, allowing precise adjustment to ensure both differential signal components arrive simultaneously at the downstream sampler in the delay detector 794.

Figure 13:
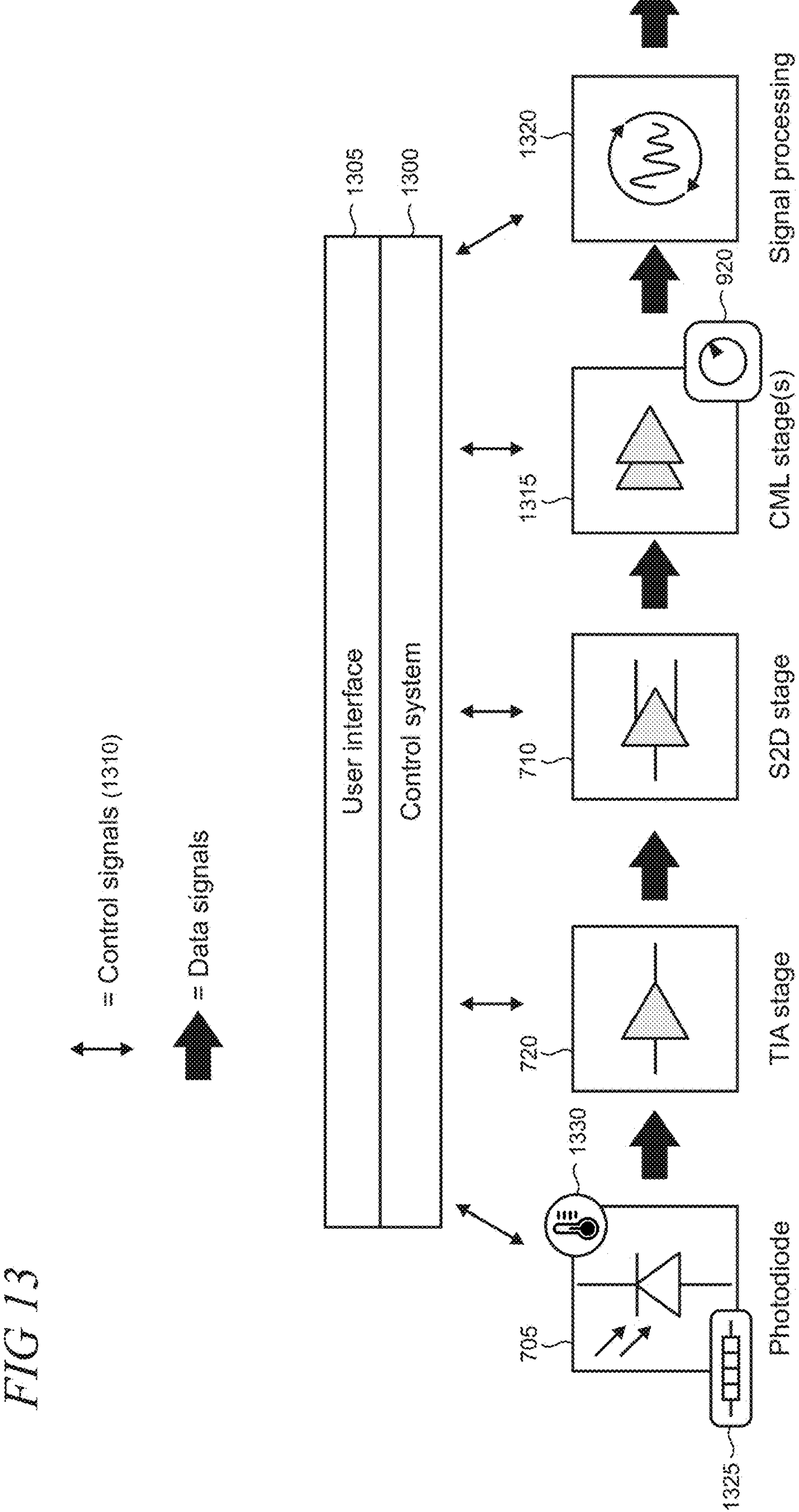
FIG. 13 shows an illustrative control system that is optionally utilized with an optical receiver circuit.

FIG. 13 shows an illustrative control system 1300 that is optionally utilized with an optical receiver circuit, for example circuit 700 shown in FIG. 7 and described in the accompanying text above. The control system provides a user interface (UI) 1305 that is configured to enable a user to set operating parameters that are utilized by the control system and/or access the components for manual control. As shown, the control system and UI are operatively coupled through appropriate interfaces to exchange control signals 1310 with components associated with the photodiode 705, TIA 720, S2D with skew control 725, CML (current-mode logic) stages 1315, and signal processing system 1320 that is configured for, for example, receive bonding, error correction, or decoding. In some implementations, the control system is configurable to control other components or parts (not shown) of the optical receiver circuit 700 described above.

The photodiode 705, in an illustrative embodiment, is configured with heating elements 1325 and temperature sensor 1330. The heating element is typically utilized to maintain a constant operating temperature for the photodiode. A constant temperature can help minimize fluctuations that vary with temperature such as dark current, photodiode responsivity (i.e., the effectiveness of the photodiode to convert incident light into electrical current), and noise. In an illustrative embodiment, the control system 1300 is configured to operate the heater in response to signals from the temperature sensor to operate the photodiode at the desired temperature. In other illustrative embodiments, the control system is configured to control the gain or other operating characteristics of the TIA 720, S2D with skew control 725, and/or CML stages 1315 based on the signal from the temperature sensor.

In an illustrative embodiment, the control system 1300 is configurable to interface with the delay detection and control circuit 796 in the S2D with skew control 725. The delay detection and control circuit can provide delay error data to the control system which can be utilized, for example, for testing, calibration, or diagnostics.

In an illustrative embodiment, the CML stages 1315 are configured with a gain control 920 that is controllable by the control system 1300. Variable gain in the CML stages can provide dynamic range adaptation to optimize performance of the optical receiver circuit 700 as photocurrent from the photodiode 705 can vary during circuit operation in some applications. By selecting appropriate gain based on input signal conditions, the control system can maintain the output within the linear range and reduce noise amplification. This adaptive gain control minimizes noise floor impact during low-signal conditions and prevents clipping during high-signal conditions. The gain control can further compensate for temperature-induced or aging-related changes in photodiode sensitivity, TIA characteristics, or S2D with skew control characteristics ensuring consistent performance over time.

Controllable gain can aid with power efficiency by reducing gain to save power and improve linearity based on input signal strength. In addition, a controllable gain stage enables a single receiver design to be versatile across multiple use cases without hardware changes in the EIC.

CML stages are commonly utilized in optical receiver front ends because they support high bandwidths and fast rise/fall times due to their current-steering operations. CML stages provide low signal swing (often several hundred millivolts), reducing voltage noise coupling and EMI, which is beneficial for maintaining the fidelity of the relatively weak analog signals from the S2D with skew control 725 throughout the high-speed signal path.

The CML stages typically utilize a differential structure that utilizes constant current consumption at the CML gain blocks which make them more robust against power supply noise and crosstalk, improving optical receiver sensitivity and overall SNR. Since the differential TIA stage outputs a differential signal, CML stages can readily interface with this topology, further amplifying the signal while preserving its differential nature for subsequent digital processing, such as clock and data recovery (CDR) or limiting amplification.

FIG. 14 is a flowchart of an illustrative method 1400 for operating a single-ended-to-differential converter circuit implemented in an EIC configured for co-packaging with a PIC that is external to the EIC, in which the PIC includes a photodiode that, when reverse biased, generates a single-ended electrical signal. Unless specifically stated, the methods or steps shown in the flowchart and described in the accompanying text are not constrained to a particular order or sequence. In addition, some of the methods or steps thereof can occur or be performed concurrently and not all the methods or steps have to be performed in a given implementation depending on the requirements of such implementation and some methods or steps may be optionally utilized.

Block 1405 includes receiving, at a single-ended input node, the single-ended electrical signal produced by the reverse-biased photodiode located in the PIC. Block 1410 includes converting, with a single-ended-to-differential converter stage coupled to the single-ended input node, the single-ended electrical signal into complementary components. Block 1415 includes driving, with a differential output stage, first and second output nodes that provide a differential output signal including the complementary components.

Block 1420 includes applying, in a first branch that drives the first output node and in a second branch that drives the second output node, respective adjustable skew correctors each configured to vary a propagation delay of its branch responsive to a control signal. Block 1425 includes asynchronously sampling, with a skew detection circuit coupled to the first and second output nodes, the complementary components of the differential output signal.

Block 1430 includes detecting, from results of the asynchronous sampling, a delay difference between the complementary components. Block 1435 includes generating the control signal based on the detected delay difference. Block 1440 includes adjusting at least one of the adjustable skew correctors with the control signal to reduce skew between the complementary components of the differential output signal.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A single-ended-to-differential converter circuit disposed in an electrical integrated circuit (EIC) configured for co-packaging with a photonic integrated circuit (PIC) that is external to the EIC in a system-in-package (SiP), the PIC including a photodiode that, when reverse biased, generates a single-ended electrical signal from incident optical radiation, comprising:

a single-ended input node adapted to receive the single-ended electrical signal produced by the reverse-biased photodiode located in the PIC;

a differential output stage having first and second output nodes that provide respective complementary components of a differential output signal;

a single-ended-to-differential converter stage coupled between the single-ended input node and the differential output stage and configured to generate the complementary components from the single-ended electrical signal along respective first and second branches;

a first adjustable skew corrector disposed in the first branch that drives the first output node and a second adjustable skew corrector disposed in the second branch that drives the second output node, each adjustable skew corrector being configured to vary a propagation delay of the respective branch in response to a control signal;

a skew detection circuit having inputs coupled to the first and second output nodes and configured to:

asynchronously sample the complementary components of the differential output signal to detect a delay difference between the complementary components, and generate the control signal based on the detected delay difference for application to at least one of the first adjustable skew corrector and the second adjustable skew corrector so as to reduce skew between the complementary components of the differential output signal;

a sampler configured to asynchronously sample the complementary components of the differential output signal to produce sampled values;

an error detector coupled to the sampler and configured to implement decision logic that identifies an error when the sampled values violate an expected differential relationship between the complementary components; and a digital counter having a first counter configured to count a number of errors, N errors, output by the error detector and a second counter configured to count a number of cycles, N cycles, of an asynchronous clock, wherein the skew detection circuit is configured to determine a delay difference between branches driving the complementary components as being proportional to a ratio of N errors to N cycles for sufficiently large N cycles, and to generate the control signal in accordance with the determined delay difference.

2. The single-ended-to-differential converter circuit of claim 1, wherein the asynchronous clock signal is not synchronized with a clock signal associated with the single-ended electrical signal received at the single-ended input node.

3. The single-ended-to-differential converter circuit of claim 1, further comprising a transimpedance amplifier coupled to the single-ended input node and configured to convert a current generated by the reverse-biased photodiode into a voltage that is provided to the single-ended to differential converter stage.

4. The single-ended-to-differential converter circuit of claim 1, wherein a period T_async of the asynchronous clock differs from an integer multiple N of a period T_clk of a clock associated with the single-ended electrical signal by a nonzero offset $\alpha T$ such that $T\_async = N \cdot T\_clk + \alpha T$, thereby enabling systematic observation over time of all relative phase relationships between the asynchronous clock and the clock associated with the single-ended electrical signal.

5. The single-ended-to-differential converter circuit of claim 1, wherein the adjustable skew corrector in each branch introduces a controllable propagation delay to align edges of the differential output signal.

6. The single-ended-to-differential converter circuit of claim 1, wherein the skew detection circuit is further configured to iteratively adjust the control signal in a closed feedback loop until the delay difference satisfies a threshold criterion.

7. The single-ended-to-differential converter circuit of claim 1, wherein the single-ended to differential converter stage comprises one or more gain stages that generate the complementary components by producing an inverted and a non-inverted version of the single-ended electrical signal.

8. The single-ended-to-differential converter circuit of claim 1, wherein the differential output stage is configured to drive a current-mode logic (CML) stage.

9. The single-ended-to-differential converter circuit of claim 8, wherein the CML stage is configured to perform clock and data recovery (CDR).

10. The single-ended-to-differential converter circuit of claim 1, wherein the single-ended input node is coupled, through an electrical interconnect to the EIC adapted for co-packaging, to a node of the PIC that is connected to the reverse-biased photodiode.

11. The single-ended-to-differential converter circuit of claim 1, wherein the skew detection circuit is configured to provide separate control signals respectively to the first and second adjustable skew correctors to independently tune delays of the first and second branches.

12. The single-ended-to-differential converter circuit of claim 1 as configured as an intellectual property (IP) block that is integrated into an XPU, or as configured as a chiplet that is coupled to an XPU via an electrical bridge.

13. The single-ended-to-differential converter circuit of claim 1 as configured in an optical receiver implemented by co-packaging the EIC and PIC, wherein the optical receiver comprises one or more of the photodiode, a TIA, the single-ended to differential converter circuit, a current-mode logic (CML) stage, and a signal processing stage.

14. The single-ended-to-differential converter circuit of claim 13, wherein the optical receiver further comprises a control system that is operatively coupled one or more of biasing controls for the photodiode, the TIA, the single-ended to differential converter circuit, the CML stage, and the signal processing stage, wherein the control system executes software or firmware for controlling operations of the optical receiver.

15. A method of operating a single-ended-to-differential converter circuit implemented in an electrical integrated circuit (EIC) configured for co-packaging with a photonic integrated circuit (PIC) that is external to the EIC, the PIC including a photodiode that, when reverse biased, generates a single-ended electrical signal, the method comprising, in the EIC:

receiving, at a single-ended input node, the single-ended electrical signal produced by the reverse-biased photodiode located in the PIC;

converting, with a single-ended-to-differential converter stage coupled to the single-ended input node, the single-ended electrical signal into complementary components;

driving, with a differential output stage, first and second output nodes that provide a differential output signal including the complementary components;

applying, in a first branch that drives the first output node and in a second branch that drives the second output node, respective adjustable skew correctors each configured to vary a propagation delay of its branch responsive to a control signal;

asynchronously sampling, with a skew detection circuit coupled to the first and second output nodes, the complementary components of the differential output signal;

detecting, from results of the asynchronous sampling, a delay difference between the complementary components;

generating the control signal based on the detected delay difference;

adjusting at least one of the adjustable skew correctors with the control signal to reduce skew between the complementary components of the differential output signal;

asynchronously sampling, with a sampler, the complementary components of the differential output signal to produce sampled values; detecting errors, with an error detector coupled to the sampler, by identifying instances in which the sampled values violate an expected differential relationship between the complementary components;

counting, with a first counter, a number of errors N errors output by the error detector and, with a second counter, a number of cycles N cycles of an asynchronous clock; and determining a delay difference between branches driving the complementary components as being proportional to a ratio of N errors to N cycles for sufficiently large N cycles, and generating the control signal in accordance with the determined delay difference.

16. The method of claim 15, further comprising iteratively performing the asynchronously sampling, detecting the delay difference, generating the control signal, and adjusting one or both of the adjustable skew correctors in a closed feedback loop until the delay difference satisfies a threshold criterion.

17. The method of claim 15, wherein the asynchronously sampling is performed based on the asynchronous clock signal and the asynchronous clock signal is not synchronized with a clock signal associated with the single-ended electrical signal received at the single-ended input node.

18. The method of claim 17, wherein a period $T\_async$ of the asynchronous clock differs from an integer multiple N of a period $T\_clk$ of a clock associated with the single-ended electrical signal by a nonzero offset $\alpha T$ such that $T\_async = N \cdot T\_clk + \alpha T$, thereby enabling systematic observation over time of all relative phase relationships between the asynchronous clock and the clock associated with the single-ended electrical signal.

19. A system-in-package (SiP) comprising:

a photonic integrated circuit (PIC) including a photodiode disposed in the PIC and configured, when reverse biased, to generate a single-ended electrical signal in response to incident optical radiation; and an electrical integrated circuit (EIC) co-packaged with the PIC and electrically coupled thereto, the EIC including:

a single-ended input node coupled to receive the single-ended electrical signal produced by the reverse-biased photodiode in the PIC;

a differential output stage having first and second output nodes that provide respective complementary components of a differential output signal;

a single-ended-to-differential converter stage coupled between the single-ended input node and the differential output stage and configured to generate the complementary components from the single-ended electrical signal along respective first and second branches; and a skew detection circuit having inputs coupled to the first and second output nodes and configured to asynchronously sample the complementary components of the differential output signal to detect a delay difference between the complementary components;

a sampler configured to asynchronously sample the complementary components of the differential output signal to produce sampled values;

an error detector coupled to the sampler and configured to implement decision logic that identifies an error when the sampled values violate an expected differential relationship between the complementary components; and a digital counter having a first counter configured to count a number of errors, N errors, output by the error detector and a second counter configured to count a number of cycles, N cycles, of an asynchronous clock, wherein the skew detection circuit is configured to determine a delay difference between branches driving the complementary components as being proportional to a ratio of N errors to N cycles for sufficiently large N cycles, and to generate the control signal in accordance with the determined delay difference.

20. The SiP of claim 19, further comprising a first adjustable skew corrector disposed in the EIC in the first branch and configured to drive the first output node, the first adjustable skew corrector configured to vary a propagation delay of the first branch in response to a control signal; and wherein the skew detection circuit is further configured to generate the control signal based on the detected delay difference for application to the first adjustable skew corrector so as to reduce skew between the complementary components of the differential output signal.

21. The SiP of claim 20, further comprising a second adjustable skew corrector disposed in the EIC in the second branch and configured to drive the second output node, the second adjustable skew corrector configured to vary a propagation delay of the second branch in response to a control signal; and wherein the skew detection circuit is further configured to generate the control signal based on the detected delay difference for application to the second adjustable skew corrector so as to reduce skew between the complementary components of the differential output signal.

22. The SiP of claim 19, further comprising a first adjustable skew corrector disposed in the first branch and configured to drive the first output node, and a second adjustable skew corrector disposed in the second branch and configured to drive the second output node, each adjustable skew corrector configured to vary a propagation delay of the respective branch in response to a control signal; and wherein the skew detection circuit is further configured to generate the control signal based on the detected delay difference for application to at least one of the first adjustable skew corrector and the second adjustable skew corrector so as to reduce skew between the complementary components of the differential output signal.

23. The SiP of claim 19, wherein the skew detection circuit is configured to provide control signals to one or more adjustable skew correctors disposed in the first or second branches to independently tune delays of the first or second branches.

24. The SiP of claim 19, further comprising a transimpedance amplifier configured to convert the single-ended electrical signal to a voltage and to drive a differential pair that forms the first and second branches.

25. The SiP of claim 19, further comprising biasing circuitry in the EIC coupled to the photodiode to establish the reverse bias.

26. The SiP of claim 19, wherein the skew detection circuit is configured for iteratively performing the asynchronously sampling, detecting the delay difference, generating a control signal, and adjusting one of both of the adjustable skew correctors based on the control signal in a closed feedback loop until the delay difference satisfies a threshold criterion.

* * * * *